United States Patent [19]

Shiga et al.

[11] Patent Number: 4,780,957

[45] Date of Patent: Nov. 1, 1988

[54] METHOD FOR PRODUCING RIGID-TYPE MULTILAYER PRINTED WIRING BOARD

[75] Inventors: Shoji Shiga, Utsunomiya; Shinichi Konishi, Hiratsuka; Hideo Suda, Imaichi; Yoshiaki Ogiwara, Nikko, all of Japan

[73] Assignee: Furukawa Denki Kogyo Kabushiki Kaisha, Tokyo, Japan

[21] Appl. No.: 55,703

[22] Filed: May 29, 1987

[30] Foreign Application Priority Data

Mar. 19, 1987 [JP] Japan .................................. 62-65124

[51] Int. Cl.$^4$ .............................................. H05K 3/36
[52] U.S. Cl. ........................................ 29/830; 29/852; 174/68.5
[58] Field of Search ................ 29/832, 852, 830, 831; 174/68.5; 428/901; 156/901, 902; 427/97

[56] References Cited

U.S. PATENT DOCUMENTS

| | | | |
|---|---|---|---|
| 3,795,047 | 3/1974 | Abolafia et al. | 29/830 X |
| 4,327,247 | 4/1982 | Mituhashi et al. | 174/68.5 |
| 4,496,793 | 1/1985 | Hanson et al. | 29/830 X |
| 4,528,072 | 7/1985 | Kurosawa et al. | 427/96 X |
| 4,616,413 | 10/1986 | Iliov et al. | 29/832 |
| 4,663,208 | 5/1987 | Ninomiya et al. | 29/852 X |
| 4,689,442 | 8/1987 | Ozaki | 29/852 X |

FOREIGN PATENT DOCUMENTS

| | | | |
|---|---|---|---|
| 115460 | 8/1984 | European Pat. Off. | 29/831 |
| 58-9399 | 1/1983 | Japan . | |
| 61-161795 | 7/1986 | Japan . | |

Primary Examiner—Timothy V. Eley
Assistant Examiner—Carl J. Arbes
Attorney, Agent, or Firm—Michael N. Meller

[57] ABSTRACT

A rigid-type multilayer printed wiring board is produced by bonding a multilayer printed wiring sheet substantially comprising a thin insulating resin layer (1), at least one metal foil printed wiring layer (8, 11) and a plurality of conductive holes (7) formed through the two layers onto a metal board (10) through an insulation laminate (9). In according this method, a multilayer printed wiring interlayer sheet consisting of the multilayer printed wiring sheet retaining a printed wiring pattern unprocessed metal foil (2b) on one surface thereof is prepared first. In this case, a given printed wiring has already been processed on the other surface and sometimes in the inner portion of the interlayer sheet. Then, the other surface of the interlayer sheet is bonded to the surface of the metal board through the insulation laminate. Thereafter, a desired printed wiring pattern is formed on the printed wiring pattern unprocessed metal foil (2b) on the one surface of the interlayer sheet.

15 Claims, 2 Drawing Sheets

METHOD FOR PRODUCING RIGID-TYPE MULTILAYER PRINTED WIRING BOARD

BACKGROUND OF THE INVENTION

1. Field of the Invention

The present invention relates to a method for producing printed wiring boards for mounting electronic components thereon and more particularly to a rigid-type multilayer printed wiring board which is excellent in economy and which ensures high-density surface mounting.

2. Description of the Prior Art

Printed wiring boards heretofore used have been so designed that a copper foil is firmly bonded to a paper-phenol board or glass-epoxy board and the necessary wiring is formed by subjecting the copper foil to an etching process or a plurality of such boards are laminated to produce the desired high-density assembly. While these printed wiring boards can be mass produced with resulting relative advantage in economy, they use resins as materials for the boards and therefore they are lacking in heat conductivity and heat dissipating properties. Thus, in the case of printed wiring boards on which components have been mounted by the high-density surface mounting, from the heat control point of view the tolerance limits are frequently reached and a particularly early solution of this problem is required in the case of power supply circuits and power electronics circuits using relatively high powers. In other words, it can be said that where the electronic components are miniaturized with a higher density and changeover to the surface mounting is simultaneously effected, the problem relating to the heat dissipating properties of the boards becomes universally important.

In an attempt to overcome the foregoing deficiency, it has been well known to use a printed wiring board employing a board of a ceramic material, e.g., alumina having a high heat conductivity. However, the use of this type of ceramic board is disadvantageous in that the production cost is two to three times higher than that of the previously mentioned printed wiring boards employing resinous boards and that their manufacture requires special processes. In addition, the ceramic board is subject to a change in size during the heating and firing and such deformation is unavoidable, thereby placing considerable limitations on the shape of the board.

On the other hand, a printed wiring board is known in which a copper foil is bonded to an aluminum board through an insulation laminate and unwanted portions of the copper foil are removed by etching, thereby producing the printed wiring board. However, the greater part of printed wiring boards of this type are single-layer single-sided printed wiring boards and thus there still exists the disadvantage of failing to fully accomplish the desired high-density mounting.

To form a printed wiring on each side of a metal board, e.g., aluminum board, it is of course essential to electrically insulate the through-hole paths and the metal board from each other and therefore not only the production process is complicated but also serious problems must be solved with respect to the electrical reliability of the through-hole portions.

On the other hand, a method is proposed, for example, in Japanese Patent Laid-Open No. 58-9399 for producing a metal-cored two-layer printed wiring board having a feature that double-sided printed wiring patterns including through-hole paths are first formed on a flexible insulating film and then the film is bonded onto a metal board through an insulation laminate. However, in the case of this method, e.g., a two-layer printed wiring board production method in which a flexible printed wiring film formed with the necessary wiring is bonded onto a metal board, the flexible insulating film holding the printed wiring is stretched by the heat and the pressing pressure which is applied during the bonding of the flexible insulating film to the metal board and deformation or damage to the printed wiring frequently occurs, thereby making it impossible to produce a multilayer printed wiring board which is high in accuracy and reliability.

SUMMARY OF THE INVENTION

With a view to overcoming the foregoing deficiencies in the prior art, it is the primary object of the present invention to provide an improved method for producing a rigid-type multilayer printed wiring board which is capable of producing, without using any special processing steps, a multilayer printed wiring board which has no danger of deforming and damaging the printed wiring and is high in accuracy and reliability, thereby making possible reduced cost and mass production.

To accomplish the above object, in accordance with one aspect of the invention, when bonding a multilayer printed wiring sheet substantially including a thin layer of insulating resin, at least one metal foil printed wiring layer and a plurality of conductive through-holes formed through the two layers onto a metal board through an insulation laminate, a multilayer printed wiring interlayer sheet comprising such multilayer printed wiring sheet retaining a printed wiring pattern unprocessed metal foil on one surface (the outermost layer on one side) thereof is prepared first. The other surface and sometimes the inner layer portion of the interlayer sheet have already been subjected to a given printed wiring processing. Then, the other surface of the interlayer sheet is bonded to the surface of the metal board through an isolation laminate and then the desired printed wiring pattern is formed on the printed wiring pattern unprocessed metal foil retained on the one surface of the multilayer printed wiring interlayer sheet.

In accordance with the invention, a starting material for the multilayer printed wiring sheet is a flexible metal foil-bonded sheet prepared by bonding a metal foil to one side or both sides of a thin insulating resin layer with an adhesive resin or by direct thermopress bonding. Thus the term multilayer printed wiring sheet covers this flexible metal foil-bonded sheet formed with the necessary printed wiring including conductive through-holes as well as one produced by laminating a plurality of such sheets. Also, the thin insulating resin layer may be composed of an insulating resin foil and an adhesive resin and their thicknesses should preferably be as small as possible provided that there is no detrimental effect on the electrical insulation from the heat transfer point of view. More specifically the thickness of the thin insulating resin layer should preferably be 0.1 mm or less. Polyimide, polyimide-impregnated glass cloth, epoxy-impregnated glass cloth, polyamide-imide, polyamide and polyester, may, for example, be used for the resin foil and particularly polyimide is well suited from the standpoint of heat resistance. Since it is especially desirable that an insulating resin is present as a laminate between the respective printed wiring layers, when forming a multilayer printed wiring sheet including three or more layers, the bonding between the printed wiring processed surface of the layers should most preferably be made through an insulating adhesive layer comprising an insulating resin foil having an adhesive resin on each side thereof.

Also, in accordance with the invention, it is optimal to use a copper foil for the metal foil in view of the conductivity, mechanical strength, the chemical and metallurgical characteristics of solder, plating or the like, economy, etc.

Further, in accordance with the invention, suitable materials for the metal bonding include metal plates made of copper, aluminum and iron and alloys mainly composed of one or more of the former in view of the cost, workability, heat dissipating properties, etc. These metal plates may be of the kind which has been preliminarily subjected to insulating treatment or corrosion-resistant treatment.

In accordance with the invention, the heat dissipating properties and heat conductivity of a multilayer printed wiring board are improved by the use of a metal board and a flexible metal foil-bonded sheet, preventing the occurrence of any deformation and damage to the printed wiring during the manufacture, thereby improving the reliability and accuracy of shape and making mass production possible through a simplified production process with the resulting reduction in cost.

The details of the features and advantages of the invention can be explained in the most specific manner by way of a two-layer printed wiring board. In other words, the two-layer printed wiring board can be considered to constitute one of the cases in which the production method of the invention is used most frequently in practice. However, as will be seen from the following description of its embodiments made with reference to the accompanying drawings, the invention is not limited to the two-layer printed wiring board and it is applicable to a wide range of applications for the production of multilayer printed wiring boards including three or more layers.

The above and other objects, features and advantages of the present invention will become more apparent from the following description of its specific embodiments taken in conjunction with the accompanying drawings.

DESCRIPTION OF THE PREFERRED EMBODIMENTS

Referring, to FIGS. 1a to 1g, there is illustrated an embodiment of the invention which is applied to the production of a two-layer printed wiring board.

Figure 1A:
FIGS. 1a to 1g are sectional views for explaining the sequence of processing steps of a two-layer printed wiring board production method according to an embodiment of the invention.

In FIG. 1a, metal foils 2a and 2b are bonded to the sides of a heat-resisting resin foil 1 to form a flexible double-side metal foil-bonded sheet which is used as a starting material for a two-layer printed wiring sheet. The resin foil 1 is a flexible electrically insulating foil of about 25 to 100 μm in thickness. The metal foils 2a and 2b are copper foils or the like and generally they are available for example in thickness of 35 μm, 18 μm and 12 μm. The resin foil 1 and the metal foils 2a and 2b are bonded to each other through an adhesive or they are directly bonded to each other by thermopress bonding without any interposition. It is to be noted that the flexibility of the double-sided metal foil-bonded sheet means the flexibility of the metal foil-bonded sheet itself due to the use of the resin foil 1 of a certain thickness, and the use of the previously mentioned thin resin foil is an essential requirement for ensuring high heat dissipating properties of the printed wiring board as will be described later.

Figure 1B:
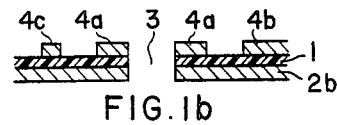
Figure 2B:
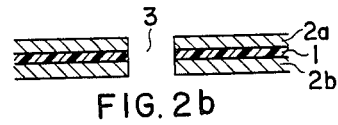

The flexible double-side metal foil-bonded sheet of FIG. 1a is then processed as shown in FIG. 1b. This step is to form holes 3 through the metal foil-bonded sheet by drilling or punching and also to form a first layer printed wiring pattern 4a, 4b and 4c on one side of the sheet by using, for example, the conventional method of forming a masking layer on the metal foil 2a by using an etching resist or photosensitive dry film and then performing, for example, an etching process thereon.

Figure 1C:
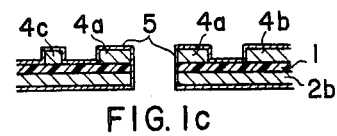

Then, in accordance with the conventional method the surface of the resin foil 1 is activated with a palladium catalyst to subject it to an electrodeless copper plating process so that as shown in FIG. 1c, the entire surface including the surface of the pattern 4a, 4b and 4c and the inner surface of the holes 3 are covered with a thin plated copper layer 5 and are made conductive.

Figure 1D:
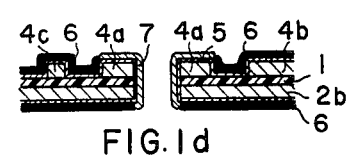

Then, as shown in FIG. 1d, the entire surface, excluding the inner surfaces of the holes 3 and their pad portion pattern 4a, is covered with a plating resist layer 6 and then a plated copper layer 7 of the desired thickness is formed on the inner surfaces of the holes 3 and the pad portion pattern 4a by electroplating.

After the electric plating layer 7 has been formed, the plating resist layer 6 is stripped off and also the electrodeless plated layer 5 is removed by etching. When this occurs, as shown in FIG. 1e, a first layer printed wiring 8a, 8b and 8c is formed on the one side of the resin foil 1.

Figure 1E:
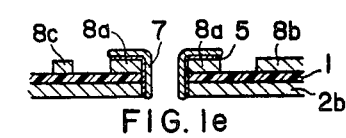
Figure 1F:
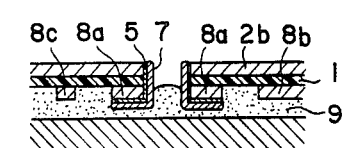
Figure 2F:
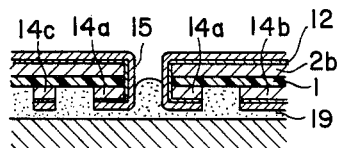

The two-layer printed wiring interlayer sheet as in the state shown in FIG. 1e is then turned upside down and bonded to a metal board 10 through an insulating adhesive layer 9 as shown in FIG. 1f. In this case, the side of the interlayer sheet which is formed with the first layer printed wiring 8a, 8b and 8c is in fact bonded to the metal board 10 through the adhesive layer 9 and the other surface of the interlayer sheet retains the metal foil 2b which has not been subjected to a printed wiring forming process so as to serve as a reinforcing material against bending and deformation. As a result, even if the sheet is subjected to pressing pressure during bonding or sometimes is subjected to the application of heat as the case may be, there is no danger of the holes 3 and the fine first layer printed wiring 8a, 8b and 8c being deformed or damaged and the most important feature of this invention resides in this respect. In other words, the resin foil 1 tends to stretch due to the application of pressure and heat during the bonding operation and particularly cracks tend to occur in the edge portions of the holes 3. The metal foil 2b acts effectively as a reinforcing material against these dangers. In this case, the thickness of the resin foil 1 is reduced as far as possible from the heat dissipation characteristic point of view and this contributes to the fact that the metal foil 2b can satisfactorily prevent the occurrence of such stretching deformation despite its reduced thickness.

Figure 1G:
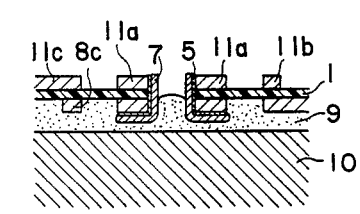
Figure 2G:
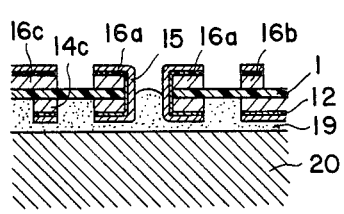

Thereafter, the operation of pattern formation according to the conventional method is performed on the other metal foil 2b which is now positioned on the top side and thus a second layer printed wiring 11a, 11b and 11c formed as shown in FIG. 1g. The second layer printed wiring 11a, 11b and 11c is further coated with a soldering resist or flex as the occasion demands and then an Au, Ag, Ni, Si, Sn-Pb alloy or other metal plating is applied for finishing purposes.

In accordance with the above-described embodiment of the invention, while the operation of making the insides of the holes 3 conductive by the electrodeless plating shown in FIG. 1c is effected over the entire surface of the printed wiring processed side, it is possible to preliminarily insulate the second layer side (2b) and then selectively render conductive the first layer printed wiring side (4a, 4b, 4c) and the insides of the holes 3. Also, in this case, the first layer printed wiring side (4a, 4b, 4c) may be subjected to the conductivity imparting process in such a manner that only the pad portions are subjected to the process and the process is not performed on those portions which do not impede the operation of rendering the holes 3 conductive.

Also, while the step shown in FIG. 1d performs the plating of the through-holes and the thick plating of the pad portions, the other wiring portions may be exposed from the resist layer 6 to apply a thick plating to these portions by electroplating. For instance, in the case of the wiring carrying a large current and the pad portions to which power transistors are connected, thickening of the printed wiring by electroplating has the effect of reducing the width of the wiring and this is useful for increasing the wiring density. In addition, this electroplating is not applied to those areas requiring the fine printed wiring as shown in FIG. 1d, with the result that the copper pattern is not unnecessarily increased in thickness and any deterioration of the etching accuracy due to the side etching is prevented, thus effectively contributing to making the wiring finer and increasing the wiring density. Further, in connection with the electroplating, since the thickening of the necessary portions of the first layer printed wiring and the thickening of the second layer printed wiring side can be effected simultaneously with the plating of the through-holes, the wiring thickening in the desired portions can be effected without preparing a separate electroplating step as a thickening process step.

With the two-layer printed wiring board produced according to the present embodiment, electronic components can be surface mounted on the surface of the two-layer printed wiring sheet bonded to the surface of the metal board and therefore excellent heat conductivity and heat dissipating properties can be ensured in the case of high packaging-density electronic circuitry, thereby greatly improving the circuit reliability.

While, in the above-described embodiment, the two-layer printed wiring sheet is bonded only to one side of the metal board, another two-layer printed wiring sheet may be similarly bonded to the other side of the metal board to produce a double-sided two-layer printed wiring board employing the metal cored board.

Referring now to FIGS. 2a to 2g showing another embodiment of the invention, the same reference numerals as used in FIGS. 1a to 1g designate the same component parts.

Figure 2A:
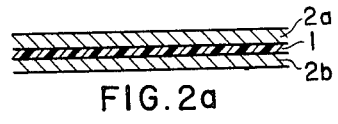
FIGS. 2a to 2g are sectional views for explaining the processing steps of a two-layer printed wiring board production method according to another embodiment of the invention.

With this embodiment, the starting material for a two-layer printed wiring sheet is a flexible double-sided metal foil-bonded sheet which has metal foils 2a and 2b bonded to the sides of a heat resisting resin foil 1 as shown in FIG. 2a.

The sheet of FIG. 2a is formed with holes 3 by drilling or punching.

Figure 2C:
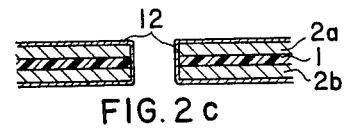

Then, as shown in FIG. 2c, the entire surface including the inner sides of the holes 3 is activated with a palladium catalyst in accordance with the conventional method and then covered with a thin plated copper layer 12 by electroless plating, thereby making the entire surface conductive.

Figure 2D:
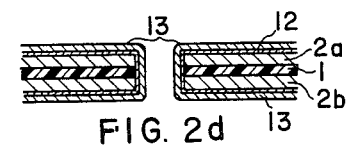

Following this, a thick plated copper layer 13 of the desired thickness is applied onto the plated copper layer 12 by electroplating according to the panel plating method as shown in FIG. 2d. In this case, the plated copper layer 13 need not always be applied over the entire surface and only the necessary portions may be plated by the pattern plating method, the partially additive method or the like.

Figure 2E:
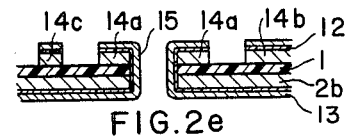

After the electroplating, as shown in FIG. 2e, in accordance with the conventional method a first layer printed wiring 14a, 14b and 14c is formed on one side of the resin foil 1, thereby obtaining a two-layer printed wiring interlayer sheet with the insides of the holes 3 being covered with a thick through-hole plated layer 15.

The two-layer printed wiring interlayer sheet as shown in FIG. 2d is then turned upside down and bonded to a metal board 20 through an insulating adhesive layer 19.

Then, the other metal foil 2b, which has been thickened with the copper plating and positioned at the top, is subjected to pattern formation in accordance with the conventional method, thereby forming a second layer printed wiring 16a, 16b and 16c.

In accordance with the embodiment shown in FIGS. 2a to 2g, it is evident that the operations of the respective processing steps are basically the same as in the production of the ordinary printed wiring board and moreover the same effects as in the previously mentioned case of FIGS. 1a to 1g can be obtained.

The production method of this invention is applicable to a multilayer printed wiring board including three or more layers. Also, in such a case, a multilayer printed wiring interlayer sheet is prepared in such a manner that one side of a multilayer printed wiring sheet or a metal foil bonded to that surface, which is to form the outermost layer of the final multilayer printed wiring board, is not subjected to the printed wiring forming process and then the operation of bonding the multilayer printed wiring interlayer sheet to a metal board is effected. By so doing, the printed wiring unprocessed metal foil is enabled to function effectively as a reinforcing material for preventing any deformation of the wiring during the bonding.

Where a multilayer printed wiring board including three or more layers is produced in accordance with the invention, it is possible to use a flexible double-sided metal foil-bonded sheet or one-sided metal foil-bonded sheet as the starting material for a multilayer printed wiring sheet and use a method which sequentially performs, for example, the following processing steps:

(1) The step of preliminarily forming the necessary printed wiring including conductive through-holes in the desired number of such starting materials as occasion demands to obtain printed wiring layer sheets.

(2): The step of laminating the desired number of printed wiring layer sheets through insulating adhesive layers to obtain a multilayer printed wiring sheet in such a manner that the outermost layer metal foils on the sides are left as not subjected to any printed wiring forming process.

(3): The step of forming a first outermost layer of printed wiring including through-holes in one outermost layer (the first outermost layer) of the multilayer printed wiring sheet to obtain a multilayer printed wiring interlayer sheet with only the other outermost layer (second outermost layer) of metal foil being not subjected to a printed wiring forming process.

(4): The step of bonding the multilayer printed wiring interlayer sheet to a metal bond with the printed wiring processed first outermost layer surface serving as a bonding surface.

(5): The step of forming a second outermost layer of printed wiring on the second outermost layer of metal foil.

Also, in this case, the invention is not limited to this method. It is to be noted that with these processing steps, a printed wiring forming method corresponding to the case of the previously mentioned two-layer printed wiring board may be used in the formation of a printed wiring including various holes whose insides are made conductive.

A specific example of the production of a multilayer printed wiring board by the previously mentioned steps (1) to (5) will now be described with reference to FIGS. 3a and 3b.

Figure 3A:
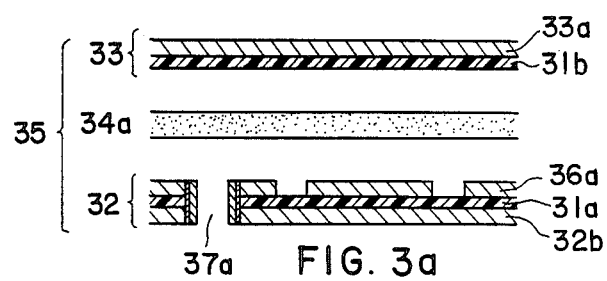
FIGS. 3a and 3b are sectional views for explaining the principal processing steps of a three-layer printed wiring board production method according to still another embodiment of the invention.
Figure 3B:
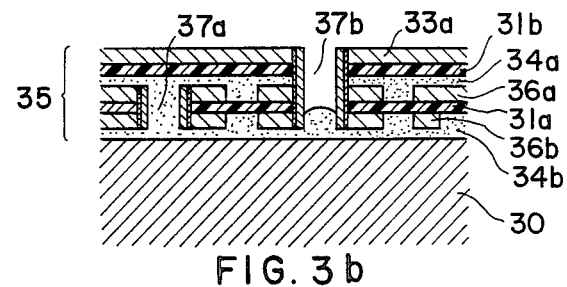

In the production of a three-layer printed wiring board, steps (1) and (2) are first performed so that as shown in FIG. 3a, a two-layer printed wiring interlayer sheet 32 is formed in which a printed wiring 36a including through-holes 37a is formed on a metal foil on one side of a resin foil 31a and a printed wiring unprocessed metal foil 32b is left on the other side of the resin foil 31a through the same steps (FIGS. 1a to 1e) as in the case of the production of the previously mentioned two-layer printed wiring board and a flexible single-sided metal foil-bonded sheet 33, including a printed wiring unprocessed metal foil 33a on one side of a resin foil 31b, are laminated through an insulating adhesive layer 34a in such a manner that the metal foils 32b and 33a having no printed wiring formed thereon are arranged on the outer sides. This results in a three-layer sheet in which the printed wiring unprocessed metal foils 33a and 32b are left as the outermost layers on the sides thereof, and then a printed wiring 36b including through-holes 37b is formed on one side (the metal foil 32b side in FIG. 3a) of the three-layer sheet by the previously mentioned step (3), thereby obtaining a three-layer printed wiring interlayer sheet 35. Then, as shown in FIG. 3b, in accordance with the step (4) the interlayer sheet 35 is bonded to a metal board 30 through an insulating adhesive resin layer 34b with the printing wiring 36b side serving as a bonding surface. Thereafter, in accordance with step (5) the desired wiring is formed on the printed wiring unprocessed metal foil 33a at the top, thereby producing a three-layer printed wiring board.

Figure 4A:
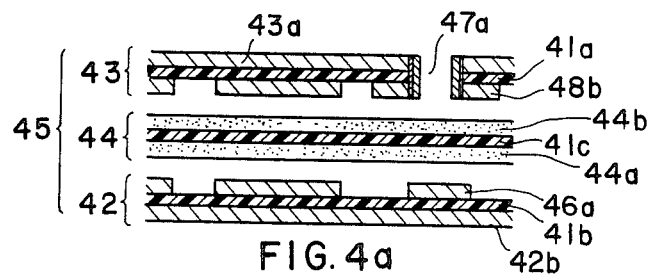
FIGS. 4a and 4b are sectional views for explaining the principal processing steps of a four-layer printed wiring board production method according to still another embodiment of the invention.
Figure 4B:
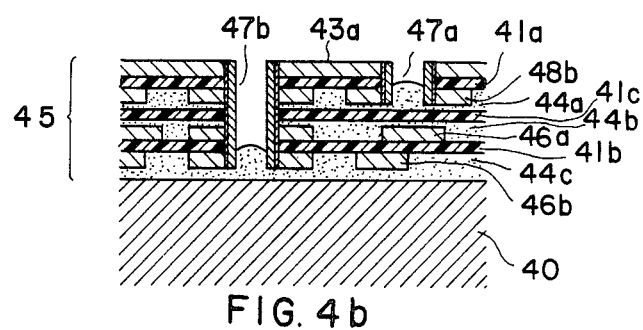

The production of a four-layer printed wiring board is effected in like manner. The step (1) is performed first so that as shown in FIG. 4a, two two-layer printed wiring interlayer sheets 42 and 43 are prepared through the similar steps (FIGS. 1a to 1e) as in the case of the production of the previously mentioned two-layer printed wiring board in such a manner that printed wiring unprocessed metal foils 42b and 43a are respectively left on one side of resin foils 41b and 41a, respectively. In this case, a printed wiring 48b including through-holes 47a is formed on one side of the interlayer sheet 43 and a printed wiring 46a is formed on one side of the other interlayer sheet 42. Then, step (2) is performed so that with an insulating adhesive sheet 44 comprising an insulating resin soil 41c coated on its sides with adhesive resins 44a and 44b being interposed, the interlayer sheets 42 and 43 are bonded to each other in such a manner that their printed wiring unprocessed metal foils 42b and 43a are turned outward. This results in a four-layer sheet in which the printed wiring unprocessed metal foils 42b and 43a are left as the outermost layers on the sides and a printed wiring 46b including through-holes 47b is formed on one side (the metal foil 42b side in FIG. 4a) by step (3), thereby preparing a four-layer printed wiring interlayer sheet 45. Then, in accordance with the step (4), as shown in FIG. 4b, the interlayer sheet 45 is bonded to a metal board 40 through an insulating adhesive resin layer 44c with the printed wiring 46b side serving as a bonding surface. Thereafter, in accordance with step (5) the desired printed wiring is formed on the printed wiring unprocessed metal foil 43a at the surface, thereby producing a four-layer printed wiring board.

It is to be noted that a six-layer printed wiring interlayer sheet can be formed by laminating the four-layer interlayer sheet 45 obtained by step (3) and the two-layer printed wiring interlayer sheet 42 or 43 obtained by step (2) through an insulation laminate in such a manner that the printed wiring unprocessed metal foils 42b and 43a are arranged on the outer sides and then forming the desired printed wiring only on the outermost layer metal foil on one side of the laminated sheet. It will be seen that in like manner, a five-layer printed wiring interlayer sheet can be formed through the combination of a two-layer printed wiring interlayer sheet and a three-layer printed wiring interlayer sheet, and additionally any multilayer printed wiring interlayer sheets each including the desired number of layers can be formed through the combination of interlayer sheets including different numbers of layers.

The following is a specific example of some two-layer printed wiring boards which were actually produced in accordance with the invention.

EXAMPLE

A flexible double-sided metal foil-bonded sheet was obtained by bonding an electrolytic copper foil of 18 mm thick to each side of a polyimide resin foil of 25 μm thick. Various holes of 0.2 to 0.5 mm in diameter were formed through the sheet by drilling. Then, a first layer wiring pattern was formed by contact bonding a photosensitive dry film (DFR, Asahi Chemical Industry Co., Ltd.) to one side of the sheet and then exposing, developing and etching the dry film with FeCl$_3$ solution.

Then, after stripping off the dry film remaining on the surface, the sheet was subjected to degreasing and picking. Then, the sheet was immersed in an HCl solution containing 1% of $PdCl_2$ and also immersed in a Cu chemical plating bath (ENPLATE-Cu 406; Japan Metal Finishing Co., Ltd.) of about 60° C. for 20 minutes, thus applying an electrodeless copper plating of about 0.5 $\mu m$ in thickness. Thereafter, the first-layer printed wiring pattern side excluding the insides of the through-holes and the pad portions and the opposite side were covered with a resist and then a copper layer of 18 $\mu m$ thick was applied onto the through-hole insides and the pad portions by electrical plating with a current density of about 5 $A/dm^2$ using a copper sulfate bath (30° C.) comprising 120 g/liter $CuSO_4$, 30 g/liter $H_2SO_4$ and copper sulfate plating brightener (TOPLUNA; Okuno Chemical Industries Co., Ltd.) 5 ppm. Thereafter, the plating resist was removed and the electrodeless plated copper layer appearing at the surface was removed by etching, thereby forming a first layer printed wiring. The interlayer sheet formed with the first layer printed wiring was press-contact bonded (160° C., 15 $kg/cm^2$, 1.0 hr) to an anodized aluminum plate (450 mm×450 mm×1.2 mm) with an epoxy adhesive agent containing 20% of $Al_2O_3$ powder. A second layer printed wiring was then formed on the printed wiring unprocessed copper foil appearing at the surface in the same manner as previously. Thereafter, the assembly was finished by applying a soldering resist and a flux to it except for the electronic component mounting pad portions.

In this way, four aluminum based two-layer printed wiring boards having a conductive hole diameter of 0.2 to 0.5 mm, wiring conductor width of 0.10 to 2.0 mm and board size of 200 mm×150 mm were produced.

The products showed no breaking faults at the beginning and moreover a microscope investigation conducted on each of pieces cut from the boards showed no cracking. In addition, a test of alternately immersing each product in an oil of 250° C. and cold water was performed 50 times and the resulting variations in the electric resistance were less than about 5% of the initial value. For the purpose of comparison, a similar printed wiring sheet having preliminarily formed first layer printed wiring and second layer printed wiring and bonded to an aluminum board was subjected to the same alternate immersion test with the result that the electric resistance variations exceeded 10% of the initial value after the 10th test and breaks were caused in a part of the wiring conductors after the 25th test. The faults such as breaks were generally seen in the conductor lines of 0.15 mm width and in the vicinity of the through-holes.

From this actual production case it is seen that the production of a rigid-type multilayer printed wiring board according to the invention is extremely easy and that the thus produced printed wiring board is excellent in heat dissipation properties and heat transfer characteristic. Additionally, it is seen that the component mounting density is comparable with the conventional ceramic board and the production cost is reduced to about 50% the production cost of the ceramic board.

What is claimed is:

1. A method for producing a rigid-type multilayer printed wiring board of the type in which a multilayer printed wiring sheet substantially comprising a thin insulating resin layer, metal foil printed wiring layer and a plurality of conductive holes formed through the two layers is bonded onto a metal board through an insulation laminate, said method comprising the steps of:
    preparing a multilayer printed wiring interlayer sheet comprising said multilayer printed wiring sheet in which a printed wiring pattern unprocessed metal foil is left on one surface thereof, the other surface being already subjected to a given printed wiring forming process;
    bonding the other surface of said interlayer sheet to a surface of a metal board through an insulation laminate; and
    forming a desired printed wiring pattern on said printed wiring pattern unprocessed metal foil on said one surface.

2. A method according to claim 1, wherein said metal board is made of aluminum or an alloy thereof.

3. A method according to claim 1, wherein said metal foil is a copper foil.

4. A method according to claim 1, wherein a starting material for said multilayer printed wiring sheet is a flexible metal foil-bonded sheet made by bonding said metal foil to at least one of the sides of said thin insulating resin layer.

5. A method according to claim 4, wherein said metal foil is bonded to said thin insulating resin layer with an adhesive resin.

6. A method according to claim 4, wherein said metal foil is directly bonded to said thin insulating resin layer by thermopress bonding.

7. A method according to claim 4, wherein said thin insulating resin layer has a thickness of 0.1 mm or less.

8. A method according to claim 4, wherein said thin insulating resin layer comprises an insulating resin foil and an adhesive resin.

9. A method according to claim 8, wherein said resin foil is made of a material selected from the group consisting of polyimide, polyimide-impregnated glass cloth, epoxy-impregnated glass cloth, polyamide-imide, polyamide and polyester.

10. A method for producing a rigid-type multilayer printed wiring board comprising the following sequence of steps:
    (a) preparing printed wiring layer sheets by preliminarily forming the necessary printed wiring including conductive through-holes in a desired number of flexible metal foil-bonded sheets each thereof having a metal foil bonded to at least one side thereof;
    (b) preparing a multilayer printed wiring sheet by laminating a desired number of said printed wiring layer sheets through at least one insulating adhesive layer in such a manner that the outermost layer metal foils on the sides thereof are not subjected to a printed wiring forming process;
    (c) preparing a multilayer printed wiring interlayer sheet by forming a first outermost layer printed wiring including through-holes on a first outermost layer of said multilayer printed wiring sheet and leaving only a second outermost layer metal foil as being formed with no printed wiring;
    (d) bonding said multilayer printed wiring interlayer sheet to a metal board with said first outermost layer printed wiring processed side service as a bonding surface; and
    (e) forming a second outermost layer printed wiring on said second outermost layer metal foil.

11. A method according to claim 10, wherein in said step (a), said printed wiring is formed on said metal foils after said foils are formed through said flexible metal foil-bonded sheets.

12. A method according to claim 10, wherein in said step (a), said holes are formed through said flexible metal foil-bonded sheets after said printed wiring is formed on said metal foils.

13. A method according to claim 10, wherein at least one of said steps (a), (c) and (e) includes an operation of making the insides of said holes conductive and then thick plating said holes.

14. A method for producing a rigid-type multilayer printed wiring board comprising the following sequence of steps:
 (a) performing on a flexible double-sided metal foil-bonded sheet having a metal foil bonded to each side thereof an operation of forming a desired number of holes and an operation of forming a first layer printed wiring pattern on one of said metal foils in a predetermined order;
 (b) performing a process of electrodeless plating to make conductive at least the insides of said holes and said first layer printed wiring pattern processed surface of said flexible double-sided metal foil-bonded sheet formed with said holes and said first layer printed wiring pattern;
 (c) applying a resist layer to the entire surface excluding at least the plated through-hole portions and pad portions of said flexible double-side metal foil bonded sheet having at least the insides of said holes and said first layer printed wiring pattern processed surface made conductive by said electrodeless plating and then subjecting at least said plated through-hole portions and pad portions to thick plating by an electroplating process;
 (d) removing said resist layer with a removing solution;
 (e) removing by etching said electrodeless plated copper layer appearing from below said removed resist layer to form a first layer printed wiring on one side of said flexible double-side metal foil-bonded sheet;
 (f) bonding said flexible double-side metal foil-bonded sheet having said first layer printed wiring including through-hole portions formed on one side thereof to a surface of a metal board through an isolation laminate with said first layer printed wiring processed side serving as a bonding surface; and
 (g) forming a second layer printed wiring on said metal foil not formed with said first layer printed wiring and bonded to the other side of said flexible double-sided metal foil-bonded sheet bonded to said metal board.

15. A method of producing a rigid-type multilayer printed wiring board, comprising the following sequence of steps:
 (a) performing an operation of forming a desired number of holes though a flexible double-sided metal foil bonded sheet comprising an insulating resin foil having a metal foil bonded to each side thereof;
 (b) performing an electrodeless copper plating process to make conductive the insides of said holes formed through said flexible double-side metal foil-bonded sheet by said hole forming operation;
 (c) applying a thick plating by an electroplating process to the entire surface of said flexible double-sided metal foil-bonded sheet including said hole insides made conductive by said electrodeless copper plating process;
 (d) forming a first layer printed wiring on one side of said thick plated flexible double-sided metal foil-bonded sheet;
 (e) bonding said flexible double-sided metal foil-bonded sheet formed with said first layer printed wiring including through-hole portions on one side thereof to a surface of a metal board through an isolation laminate with said first layer printed wiring processed side serving as a bonding surface; and
 (f) forming a second layer printed wiring on said metal foil not formed with said first layer printed wiring and bonded to the other side of said flexible double sided metal foil-bonded sheet bonded to said metal board.

* * * * *